DEVICE FOR MOUNTING AND BONDING SEMICONDUCTOR WAFERS

Filed Oct. 18, 1960 8 Sheets-Sheet 1

INVENTORS
ALBERT SOFFA
BY THOMAS L. ANGELUCCI
Paul & Moyerman
ATTORNEYS

March 26, 1963 A. SOFFA ETAL 3,083,291

DEVICE FOR MOUNTING AND BONDING SEMICONDUCTOR WAFERS

Filed Oct. 18, 1960 8 Sheets-Sheet 2

INVENTORS
ALBERT SOFFA
BY THOMAS L. ANGELUCCI
Belher & Moyerman
ATTORNEYS

DEVICE FOR MOUNTING AND BONDING SEMICONDUCTOR WAFERS

Filed Oct. 18, 1960 8 Sheets-Sheet 3

INVENTORS
ALBERT SOFFA
THOMAS L. ANGELUCCI
BY Belker & Maguman
ATTORNEYS

INVENTORS
ALBERT SOFFA
THOMAS L. ANGELUCCI
BY Belker & Moyerman
ATTORNEYS

DEVICE FOR MOUNTING AND BONDING SEMICONDUCTOR WAFERS

Filed Oct. 18, 1960 8 Sheets-Sheet 5

INVENTORS
ALBERT SOFFA
THOMAS L. ANGELUCCI
BY Belcher & Moyerman
ATTORNEYS

INVENTORS
ALBERT SOFFA
BY THOMAS L. ANGELUCCI
Belcher & Mayerman
ATTORNEYS

March 26, 1963 A. SOFFA ETAL 3,083,291

DEVICE FOR MOUNTING AND BONDING SEMICONDUCTOR WAFERS

Filed Oct. 18, 1960 8 Sheets-Sheet 7

INVENTORS
ALBERT SOFFA
BY THOMAS L. ANGELUCCI

Silber & Mazzeman

ATTORNEYS

March 26, 1963 A. SOFFA ET AL 3,083,291

DEVICE FOR MOUNTING AND BONDING SEMICONDUCTOR WAFERS

Filed Oct. 18, 1960 8 Sheets-Sheet 8

INVENTORS
ALBERT SOFFA
THOMAS L. ANGELUCCI

BY *[signature]*

ATTORNEYS

United States Patent Office 3,083,291

Patented Mar. 26, 1963

3,083,291

DEVICE FOR MOUNTING AND BONDING SEMICONDUCTOR WAFERS

Albert Soffa, Wynnewood, and Thomas L. Angelucci, Philadelphia, Pa., assignors to Kulicke & Soffa Mfg. Co., Philadelphia, Pa., a corporation of Pennsylvania Filed Oct. 18, 1960, Ser. No. 63,380
13 Claims. (Cl. 219—158)

This invention relates to a device for mounting and bonding wafers of semiconductor upon partially assembled semiconductor translating devices. More particularly, it relates to a device for positioning a wafer of semiconductor, with extreme accuracy, at a predetermined location upon a partially assembled translating device and, thereafter, bonding the wafer to the device without any risk of upsetting registration.

Semiconductor translation devices such as, for example, transistors of all types, including diodes and rectifiers, as well as devices such as photocells, employ wafers of semiconductor. These semiconductor wafers are used in the form of rectangles usually obtained from an ingot of semiconductor by slicing it and thereafter dicing the individual slices. Semiconductors commonly comprise materials such as germanium, silicon, germanium-silicon alloys, indium-antimonide, gallium-antimonide, aluminum-antimonide, indium-arsenide, gallium-arsenide, gallium-phosphorous alloys, indium-phosphorous alloys, and copper oxides. The wafers are extremely small and often have stripes of materials such as gold or platinum on one surface thereof which are barely visible to the naked eye. Yet, if the electrical values of the finished product are to meet quality control standards, these small wafers must be positioned and bonded with extreme accuracy upon a header or "platform," "can," "stem" or "transistor mount" in the course of assembling the translating device. Furthermore, in the case of wafers having stripes or coatings of other conductors on a particular surface, the crystal must be properly oriented before positioning with the correct side up.

In the past, all such wafer assemblies have been manual, with operators solely dependent upon simple tools and periodic microscopic examination of the partially assembled devices. Such manual operations, when compared to machine assisted assembly found in other industries, added nothing to the final product except cost. Such machines as have been available in the past were rudimentary and employed, like the primitive tweezer, the expedient of bringing the wafer to the work rather than the more economical expedient of bringing the work to the wafer.

Accordingly, it is an object of this invention to provide a device for accurately positioning and fusion bonding a wafer of semiconductor upon a partially assembled semiconductor translating device at a predetermined location thereon.

A further object of the invention is to provide a device for placing wafers of semiconductor in positive registration with a predetermined location on a partially assembled semiconductor translating device prior to any contact between said wafer and said translating device.

Another object of the invention is to provide a device for fusion bonding semiconductor wafers to partially assembled semiconductor translating devices.

Still another object of the invention is to provide a horizontal slider capable only of lateral motion between exact but adjustable limits of travel.

The objects of the invention also include the provision of a device for the transfer of pre-positioned wafers of semiconductor which is incapable of exerting enough pressure upon said wafers to split, crack or otherwise damage them.

It is also an object of the invention to provide a device of the character described which is simple in operation, economical to produce, efficient and accurate to use and operate and infallibly reliable in the positioning of semiconductor wafers upon partially assembled semiconductor translating devices.

These and other objects of the invention will be apparent to those skilled in the art from the disclosure in the following specification, appended claims and drawings, wherein like numerals designate like parts, and wherein:

Figure 3:
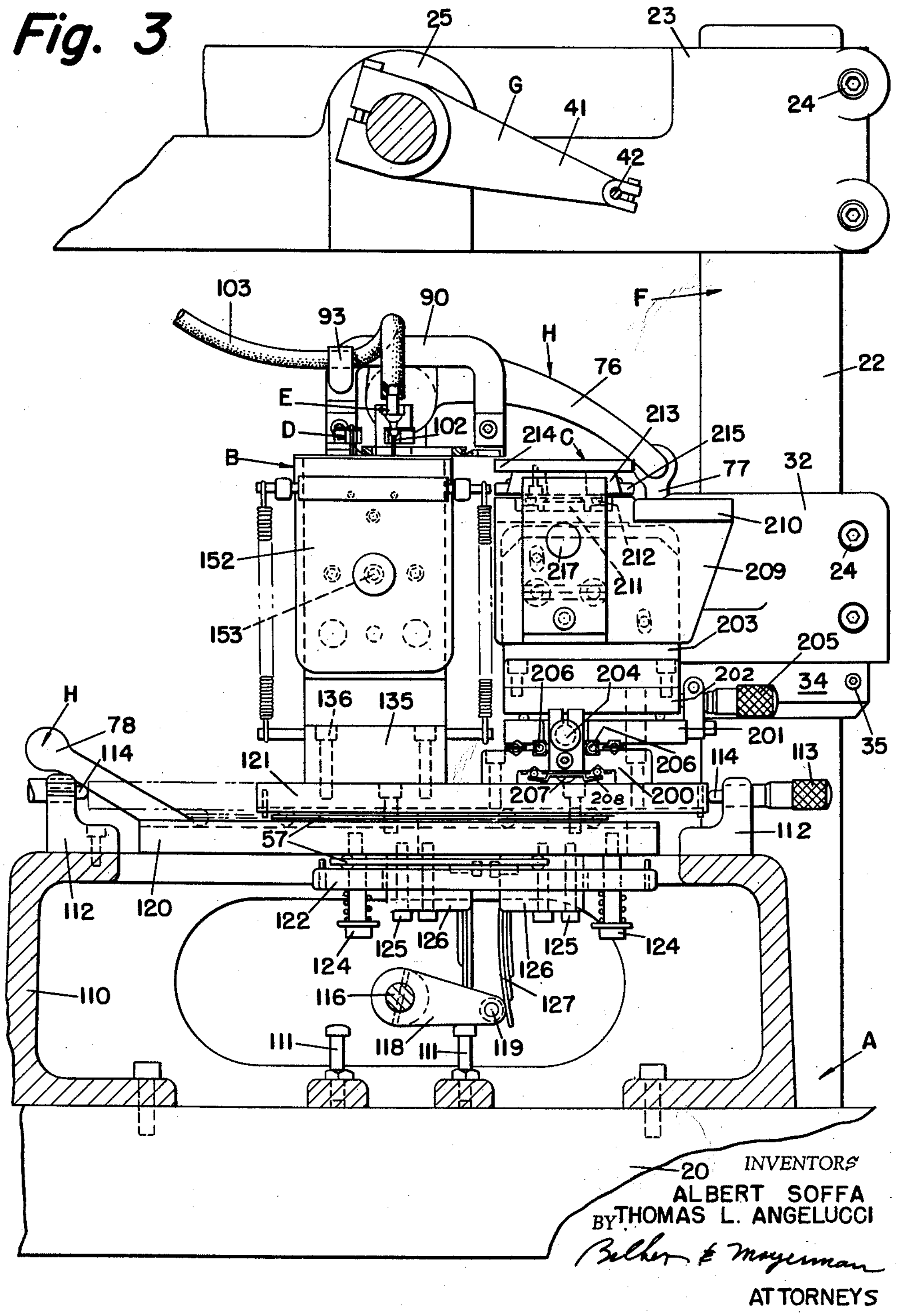
FIGURE 3 represents a front elevational view, partially cut away, of a machine embodying the invention.
Figure 8:
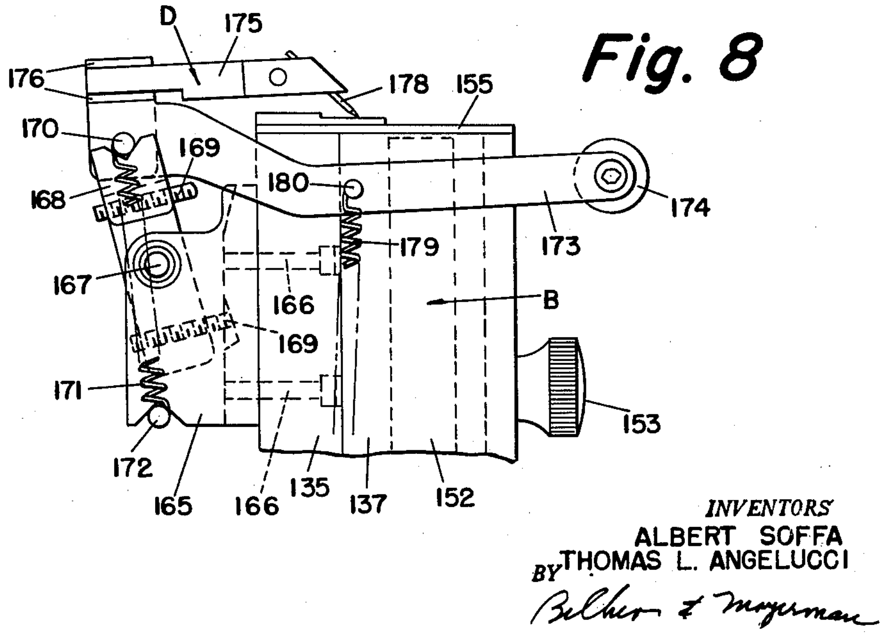

FIGURE 8 also represents a fragmentary partial left side elevational view of the machine of FIGURE 3 but shows various components oriented in non-clamping position.

Figures 9, 10, 11:
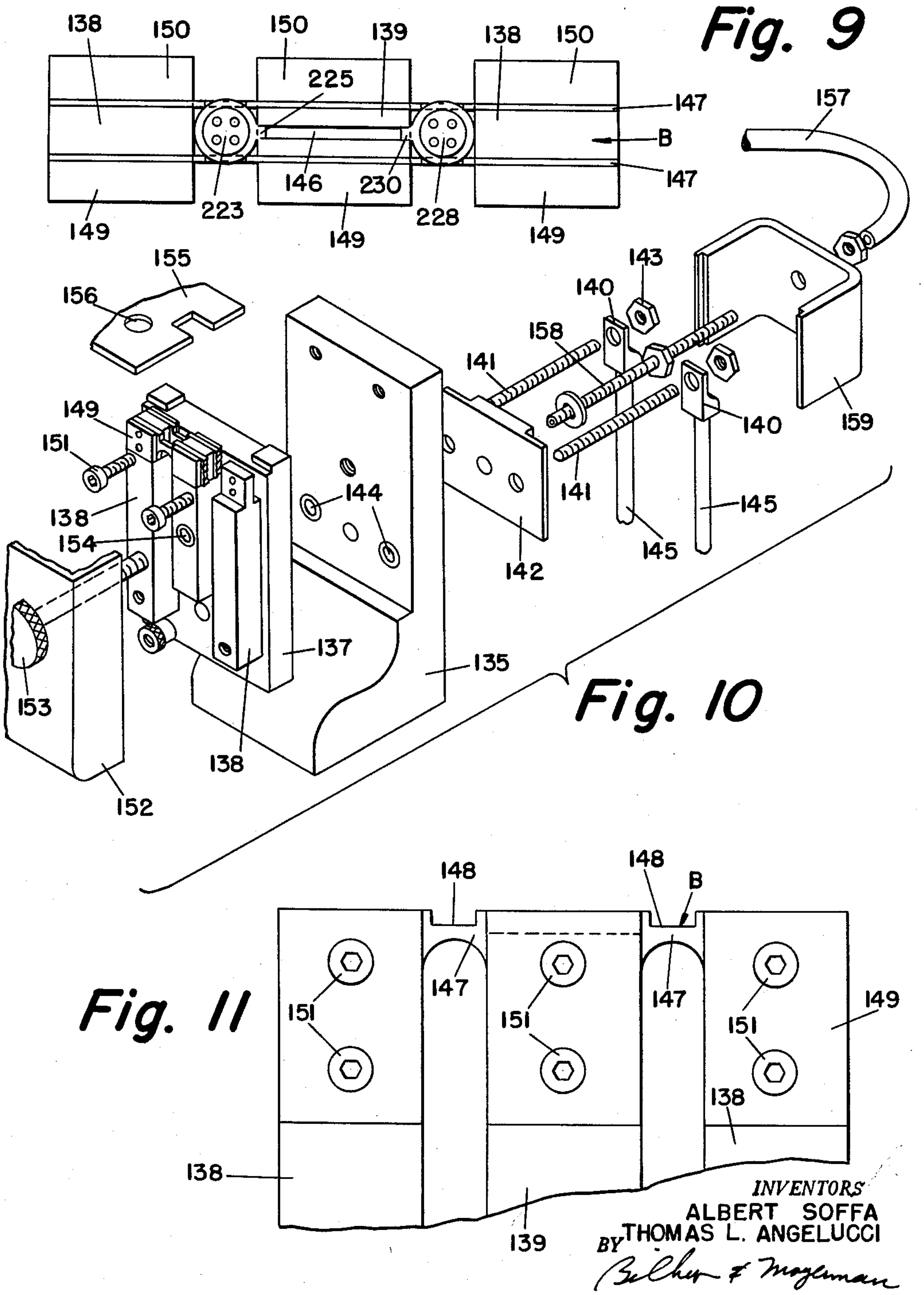

FIGURE 9 represents an enlarged fragmentary top view of the heaters and supports for partially assembled semiconductor translating devices.

FIGURE 10 represents an exploded assembly of the entire heater assembly, which is part of the machine shown in FIGURE 3.

FIGURE 11 is an enlarged partial front view of the heaters shown in FIGURE 9.

Figure 6:
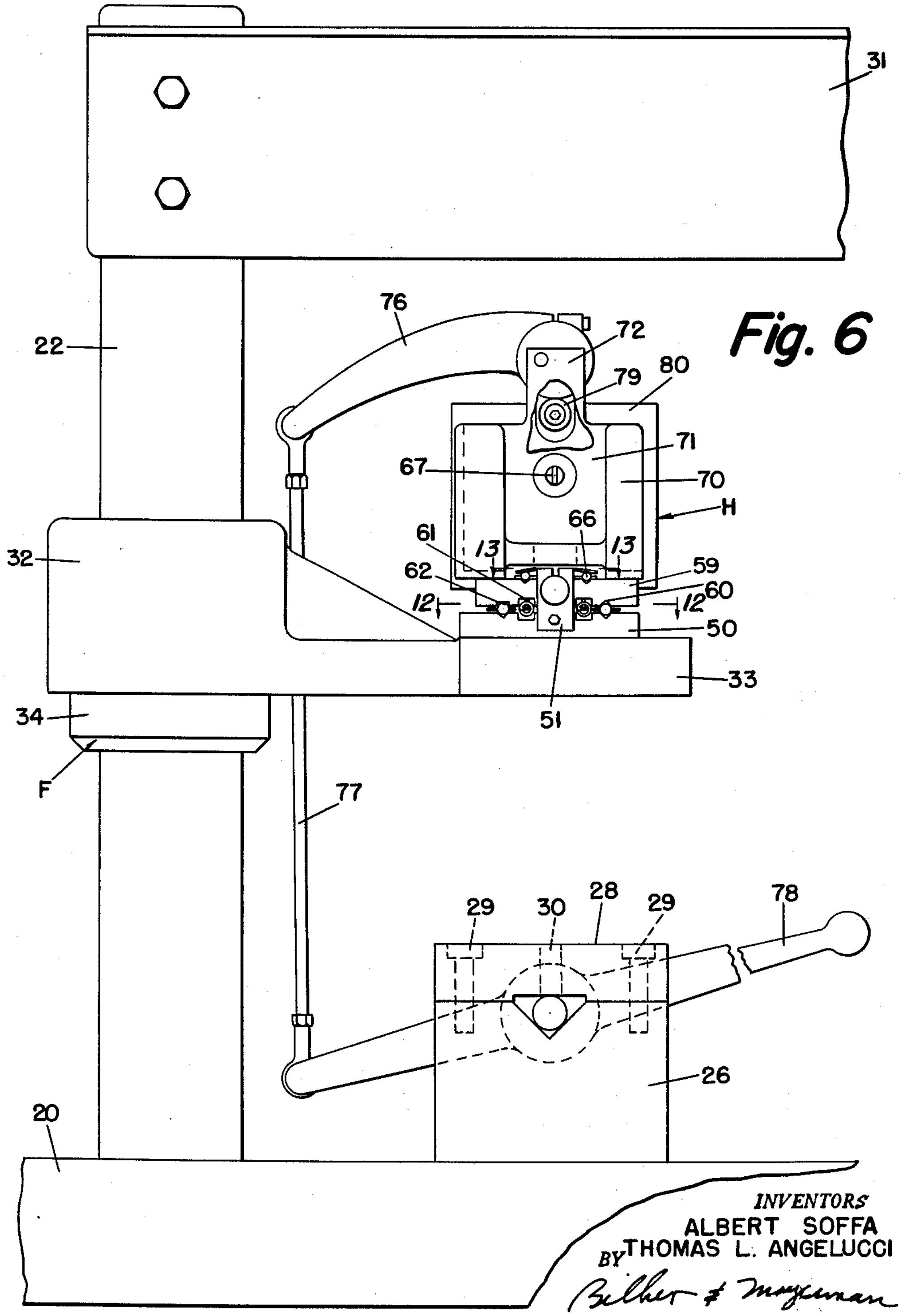
FIGURE 6 represents a partial rear view of the machine shown in FIGURE 3.
Figure 12:
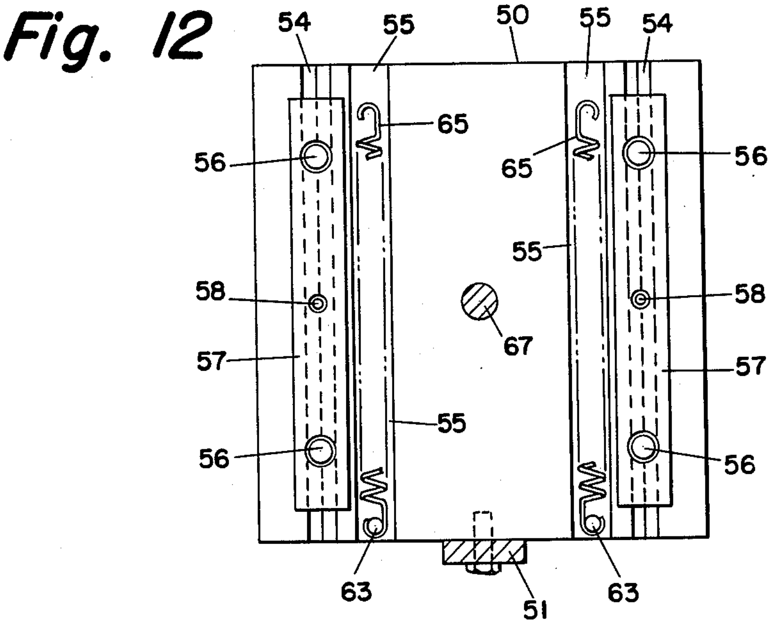

FIGURE 12 is a horizontal section taken along line 12—12 of FIGURE 6.

Figure 13:
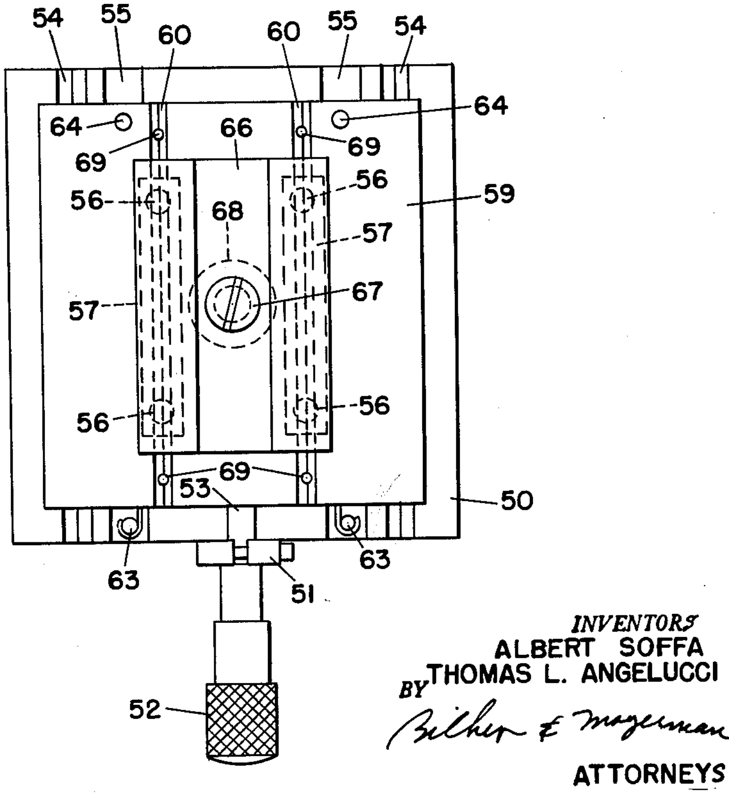

FIGURE 13 is a horizontal section taken along line 13—13 of FIGURE 6.

Figure 7:
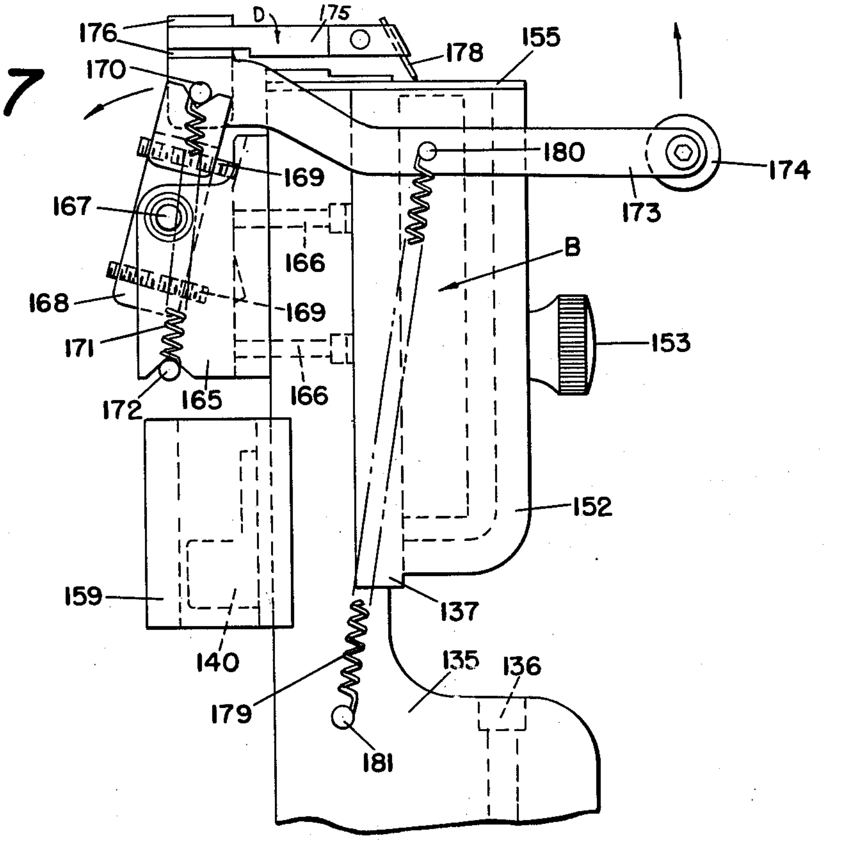
FIGURE 7 represents a partial left side elevational view of the machine shown in FIGURE 3 with various components oriented in a work clamping position.
Figure 14:
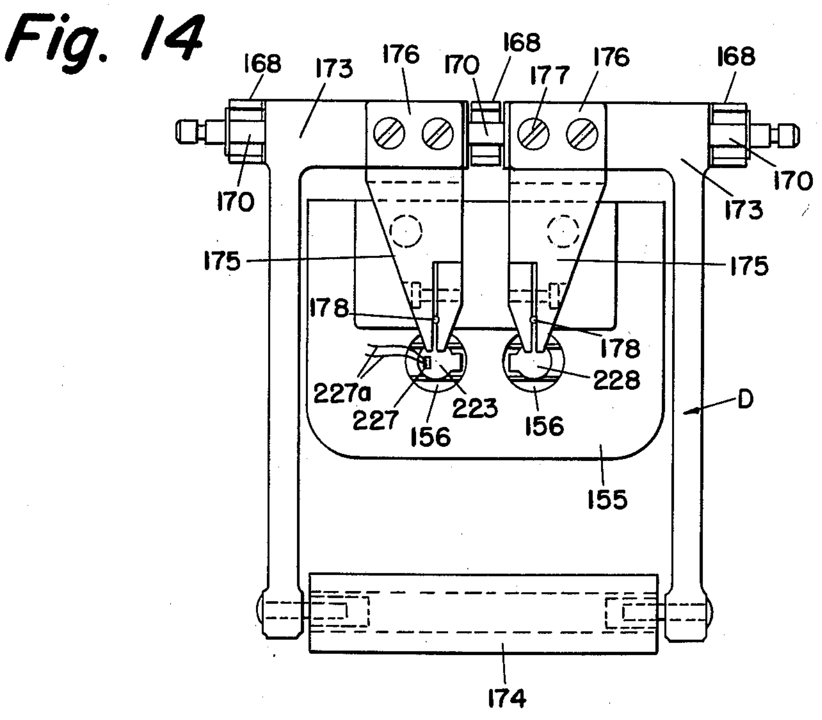

FIGURE 14 is a top view of the clamping assembly of FIGURE 7.

Figure 15:
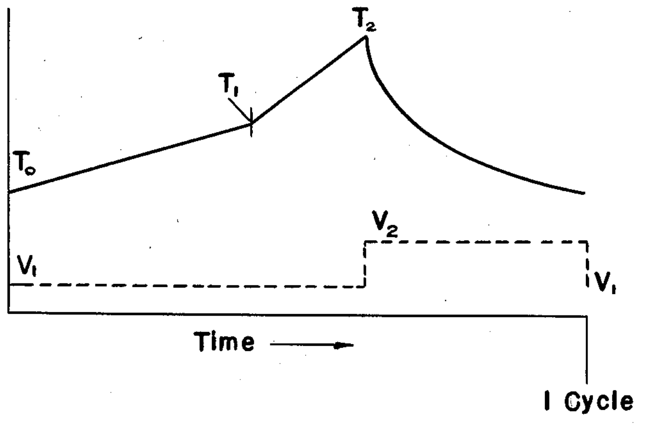

FIGURE 15 is a graph indicating time-temperature and time-gas volume relationships employed in the method of the invention.

1. *Logic of Wafer Positioning Function*

Figure 1:
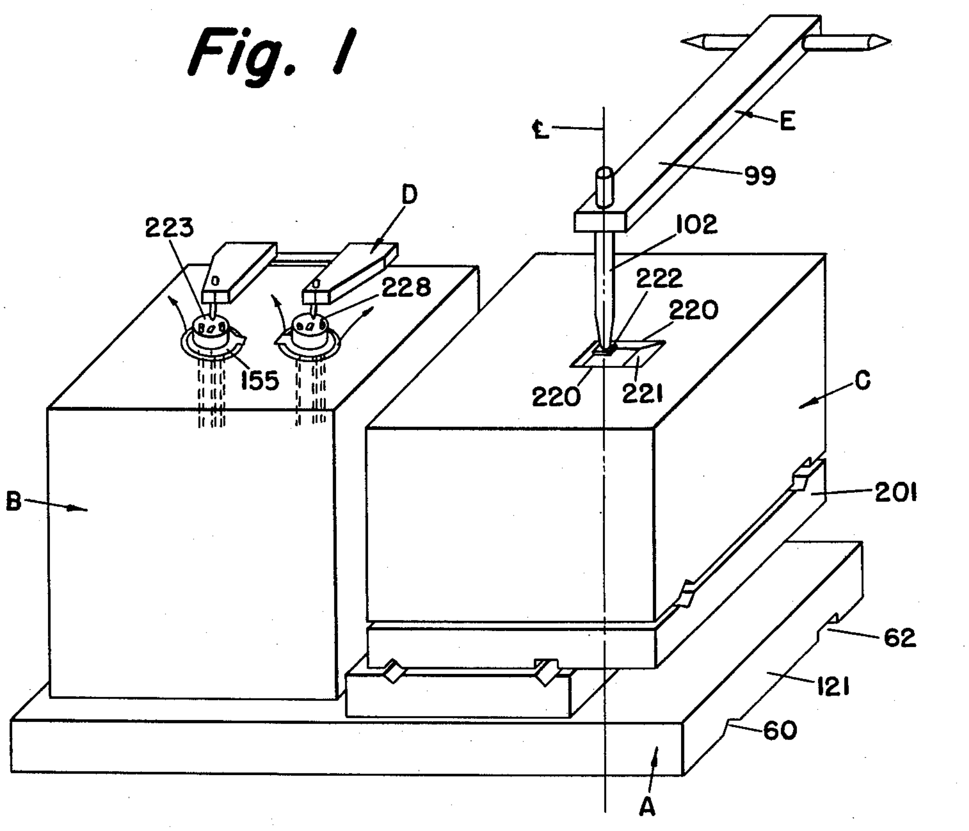
FIGURE 1 is a partial diagrammatic perspective representation of a machine embodying the invention which is shown in a position where a wafer of semiconductor is about to be lifted.
Figure 2:
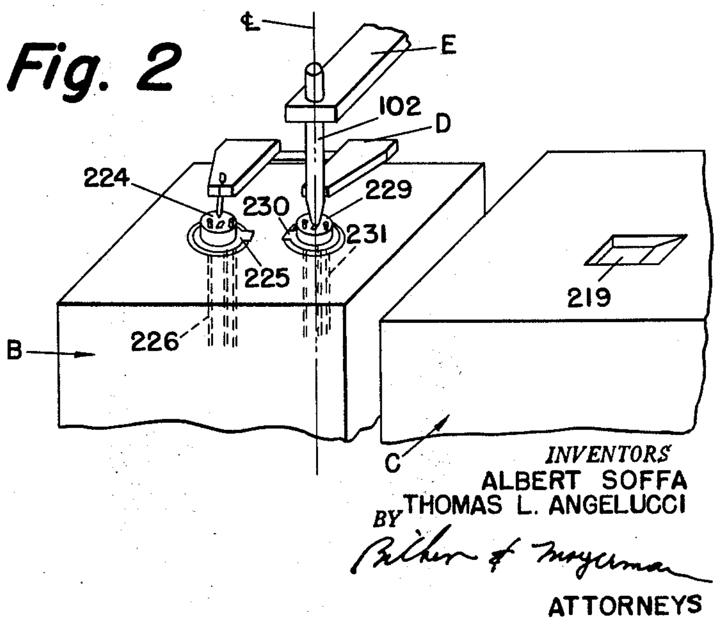
FIGURE 2 is a partial diagrammatic perspective representation of the machine of FIGURE 1 shown in a position wherein the wafer is being placed upon the partially assembled semiconductor translating device.

Referring now to FIGURES 1 and 2 which are diagrammatic and used primarily for a preliminary understanding of the machine, it will be observed that the device includes a horizontal or lateral slider assembly A, upon one end of which is mounted a partially assembled semiconductor translating device heating and work holding column B, referred to hereinafter as the heating column, and upon the other end of which is adjustably mounted a semiconductor wafer registration column C, referred to hereinafter as the registration column. Associated with heating column B, and moving therewith, is clamping assembly D which, as shown, exerts a downward force upon two partially assembled semiconductor devices.

The slider A is capable only of horizontal motion along a fixed axis. In FIGURE 1 it is shown at one extreme of travel (i.e. all the way to the left) and in FIGURE 2 it is at its other extreme of travel (i.e. all the way to the right). Columns B and C move laterally with slider A upon which they are both mounted.

Intermediate columns B and C, are mounted independently thereof on a fixed axis (indicated as a center line common to FIGURES 1 and 2) is a vacuum needle assembly E.

Basically, the device in the position shown in FIGURE 1 allows a vacuum needle 102 to be lowered to pick up a positively registered wafer of semiconductor 222. The needle is then raised (carrying the wafer with it) and the slider A moved to the position shown in FIGURE 2. When the needle is lowered, the wafer will contact a partially assembled translating device 228, mounted in column B, at a predetermined position on its head 229 and, while in that position the wafer may be fusion bonded to the head as will be subsequently explained.

The other major sub assemblies of the device, as shown in FIGURES 2–14, include a frame F, a microscope assembly G, and a vacuum needle manipulator assembly H.

2. *Frame*

Figures 4, 5:
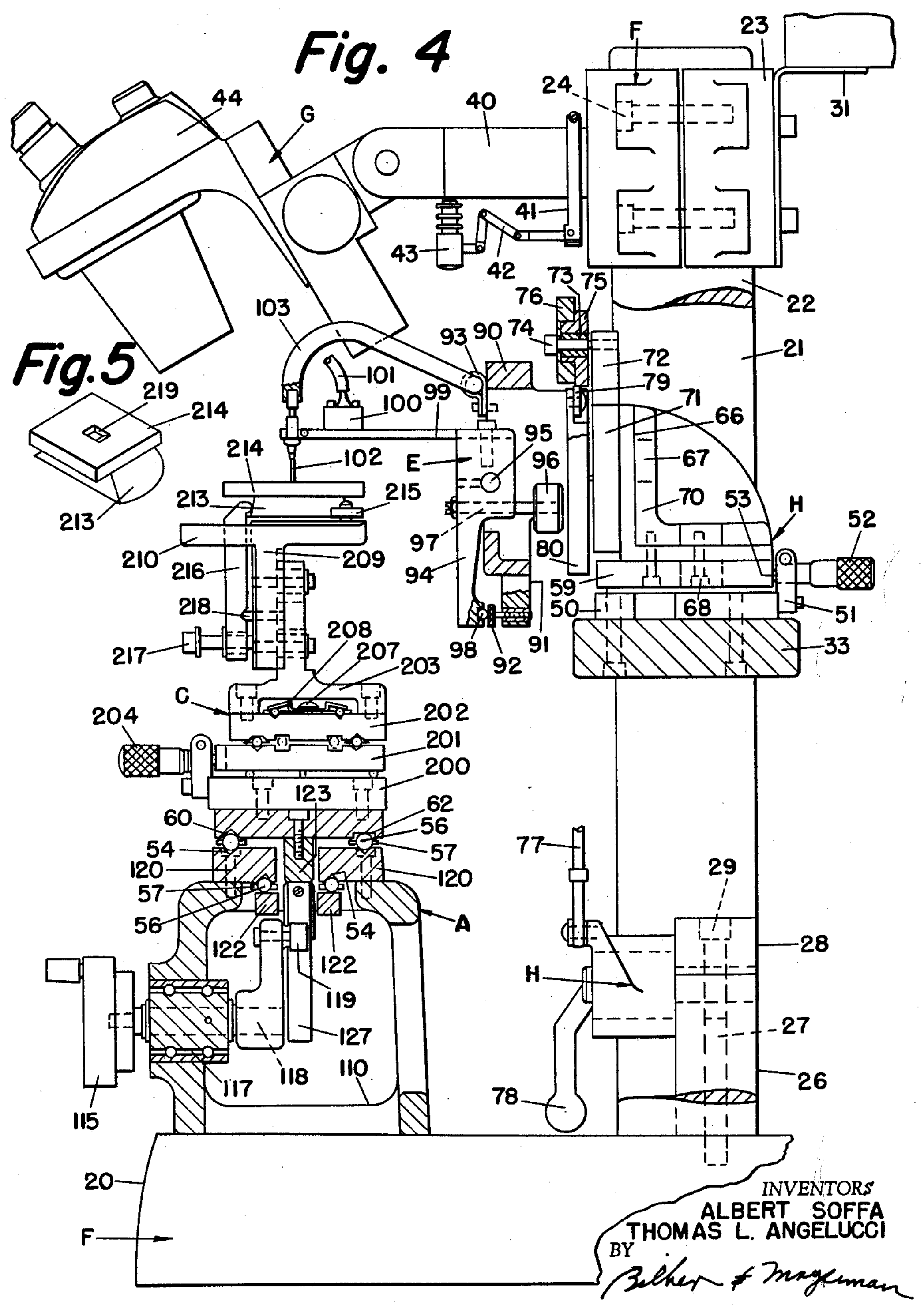
FIGURE 4 represents a right side elevational view, partially cut away, of the machine shown in FIGURE 3.
FIGURE 5 represents an element of the machine shown in FIGURES 3 and 4 and is in perspective.

The frame F is shown in FIGURES 3, 4 and 6. It includes a base casting 20 on which are mounted vertical tubular posts 21 and 22. The tops of the posts are connected and spanned by a vertically positionable yoke 23 which is mounted on the posts with a split yoke and releasably positioned thereon with split yoke clamping screws 24. The yoke 23 is also provided with an integral journal housing 25 which is used in connection with the mounting of microscope assembly G. A pillow block 26 is mounted on base 20 with screws 27. A cap 28 is, in turn, mounted on block 26 with screws 28. As shown in FIGURE 6, cap 28 is further provided with a shaft retaining screw 30. A shelf 31 having an L-shaped cross section is conveniently mounted on yoke 23 and serves as a convenient support for auxiliary equipment normally associated with the device. A support arm 32 which terminates in a split yoke and includes an integral cantilevered shelf 33 is mounted on column 22 utilizing additional screws 24. Beneath the arm a clamping collar 34, having set screws 35 is provided for ease in positioning the arm.

3. *Microscope Assembly*

The microscope assembly G, as shown in FIGURES 3 and 4, is mounted in housing 25. It is supported by mounting shaft 40 which is rotatably journaled in housing 25. A dual split yoke clamping arm or pitman 41 is clamped to shaft 40 and supports a series of articulated links 42 to the last of which is pivotally attached a suitable light source 43. A conventional stereo microscope 44 is pivotally and rotatable attached to shaft 40. Conventional conductors supply current to light 43 and the microscope and light may be so positioned that any given working area of head 229 may always be illuminated and continually observed.

4. *Vacuum Needle Manipulator Assembly*

Vacuum needle manipulator assembly H is best understood with reference to FIGURES 4, 6, 12 and 13. FIGURES 12 and 13, while particularly pertaining to this assembly, are also of use in understanding a structure encountered elsewhere in the device and to that extent are generalized views to which future references will be made. The entire manipulator assembly is mounted on cantilevered shelf 33 and is additionally supported in pillow block 26. It includes a baseway or guideway 50 which is attached to shelf 33. Mounted on one edge of baseway 50 is a micrometer mount 51 of the split yoke type within which is adjustably retained a micrometer head 52 having a spindle 53. This type of mount is used elsewhere throughout the device.

Guideway 50 is provided with a plurality of parallel V-shaped grooves 54 and a plurality of generally U-shaped springways 58, as may best be seen in FIGURE 12. Riding within grooves 54 are a plurality of ball bearings 56. These ball bearings are kept in predetermined longitudinal relationship by thin, generally rectangular, foraminous spacer plates 57 which include holes to receive the bearings as well as holes to receive travel limiting pins 58 which are mounted in baseway 50 at the vertices of grooves 54. These pins extend upwardly as far as the top of plate 57 and serve to retain the plate as well as the bearings within fixed limits of longitudinal travel.

Atop guideway 50 is mounted a horizontal slider 59 which is capable only of reciprocal horizontal motion along a fixed axis, termed in this instance a Y-axis. This slider is provided, on its underside, with a V-groove 60 and springways 61 which are identical to and aligned with corresponding elements in the upper surface of baseway 50. A U-shaped groove 62 is also provided. The springways 61 in slider 59 are provided with spring hangers 64 which are at the ends of the springway remote from bracket 51. The springways 55 in base 50 are similarly provided with spring hangers 63 at the end proximate bracket 51. When the baseway 50 and the slider 59 are assembled and the springs 65 attached to hangers 63 and 64, the net effect is to resiliently urge slider 59 into contact with spindle 53, thus allowing for positive micrometer positioning of the slider. Slider 59 is kept in spaced apart relationship to baseway 50 by ball bearings 56 and, of course, the ball bearings minimize friction between these elements. It should be noted that the flat bight of generally U-shaped groove 62 makes the assembly of slider and baseway easier than were all cooperating grooves V-shaped and allows for larger machining tolerances. Furthermore, the provision of lateral freedom for one row of ball bearings 56, as by grooves 54 and 62, compensates for temperature effects and obviates the necessity for frequent adjustment.

The upper surface of slider 59 includes additional V-grooves 60 in which are positioned ballbearings 56 and associated with which are spacer plates 57. These elements function just as they do in connection with the underside of the slider and their construction is similar. A means for securing slider 59 to baseway 50 is shown in FIGURES 6, 12 and 13. A retaining spring 66, which is generally gull-winged in cross section and rectangular in plan, is placed atop ball bearings 56 and is attached to base 50 with retaining screw 67. An aperture or internal bore 68 is provided in slider 59 and screw 67 passes through this bore and is screwed into a drilled and tapped hole provided in baseway 50. Therefore the screw does not prevent motion of slider 59 along its fixed Y-axis. The shape of spring 66 serves both to laterally retain upper ball bearings 56 and secure slider 59 to baseway 50. The size of bore 68 is a function of the desired limits of travel of slider 59 and these limits may be fixed by the use of limit pins 69 (FIGURES 3 and 13) in grooves 54 or by the size of the bore 68 itself or by both.

A generally L-shaped bracket 70 is used to mount vertical (i.e. Z-axis) baseway 71 on horizontal (i.e. Y-axis) slider 59 using screws as shown in FIGURE 4. The construction of vertical baseway 71 is similar to that of baseway 50 except that it also includes an integral bearing support tab 72 and is provided with an internal bore similar to that provided in slider 59. A conventional bearing assembly 73 is journaled to tab 72 with stud 74. An eccentric 75 is mounted on the perimeter of bearing 73 and the eccentric is provided with a shoulder which is adapted to abut a matching shoulder of crank 76. The crank is easily mounted on the eccentric by virtue of its split yoke construction. To the other end of crank 76 is pivotally attached tie rod 77. The remote end of the tie rod is pivotally attached to the vacuum needle manipulator operating handle 78 which includes a circumferentially grooved shaft journaled into the bearing aperture between pillow block 26 and cap 28 and retained therein by friction screw 30. Movement of handle 78 activates crank 76 and rotates eccentric 75 about stud 74.

Eccentric 75 is always in resilient contact with the perimeter of bearing 79 which is located in a recess in vertical slider (i.e. Z-axis slider) 80 and is pinned thereto. Slider 80 is similar to slider 59 and it is retained on baseway 71 using the mechanism shown in FIGURE 13, including a retaining screw 67 which, while free to move within the internal bore of baseway 71, allows a retaining spring 66 to tension slider 80 toward bracket 70. Internal springs of the type shown in FIGURE 12 bias slider 80 upward with respect to fixed baseway 71, thus keeping bearing 79 in resilient contact with eccentric 75 and, in effect, spring-loading operating handle 78. Movement of handle 78 thus produces pure vertical motion of slider 80, whereas the horizontal position of the face of the slider is adjusted with micrometer 52.

5. *Vacuum Needle Assembly*

The vacuum needle assembly E includes a generally rectangular vacuum needle support frame 90 which is attached to vertical or Z-axis slider 80 as shown in FIGURES 3 and 4. The frame 90 further includes a limit block 91, which may be integral therewith, within which is threadedly mounted thumb screw 92. A vacuum hose strain relief clamp 93 is appropriately mounted on frame 90. Within the frame, pivot casting 94 is rotatably suspended with rocker needle bearings 95. A counterweight 96 is threadedly mounted on set screw 97 which is, in turn, mounted in casting 94. The lower tongue of casting 94 includes a ball 98 adapted to contact the head of thumb screw 92. If desired, ball 98 and screw 97 may be appropriataely insulated and wired into a rudimentary alarm system to give an audible or visual indication of the fact that these two members are not in contact, a condition indicating that the casting is tilted upward.

Cantilevered from the top of casting 94 and suitably attached thereto is a needle clamp arm 99. An electric oscillator 100, to which current from an electrical vibration amplitude control device is carried by wires 101, may be advantageously mounted on arm 99 for accelerating fusion bonding of wafers. Hollow vacuum needle 102 is adjustably mounted in a split yoke provided at the end of arm 99. A vacuum hose 103 connects the needle to a vacuum source, such as a pump, which may conveniently be mounted on shelf 31. Clamp 93 allows a fixed amount of slack in hose 103 so that movement of arm 99 is unrestrained.

6. *Lateral Slider Assembly*

The lateral slider assembly A, as shown in FIGURES 2 and 3, serves as a base, capable of precisely limited reciprocal horizontal motion along a fixed axis, upon which heat column assembly B and registration column assembly C are both mounted.

The assembly comprises a housing 110, generally resembling a hollow rectangular box, which may be bolted to base casting 20 as shown. Associated with the housing are vertically adjustable crank stops 111, as well as micrometer mounts 112 located at each end of housing 110. In the mounts 112 are placed micrometers 113 having spindles 114. A crank assembly including operating knob 115, crank shaft 116, journal bearing assembly 117 and crank 118, which terminates in a pivotally mounted crank bushing 119, is mounted in the face of the housing 110 and turning knob 115 causes bushing 119 to describe an arcuate path. The rotation of crank 118, as may be observed in FIGURE 3, is limited by stops 111.

The top of housing 110 includes a centered longitudinal aperture and generally rectangular parallel tracks 120 are secured to the housing, intermediate mounts 112, one on each side of the aperture. Since these tracks serve the same function as the baseways or guideways previously discussed they are, accordingly, provided with top and bottom V-grooves 54, ball bearings 56 and spacer plates 57. Riding on top of tracks 120 is a top slider 121 and beneath the tracks a bottom slider 122. The bottom slider, in plan view, is shaped like a hollow rectangle, and the internal longitudinal cut-out has a width which approximates the distance between tracks 120. Attached to the bottom of top slider 121 is a T-bar 123 which fits into the aperture between tracks 120. The bottom slider 122 is attached to T-bar 123 with spring-loaded shouldered studs 124 at its ends and the spring pressure urges the bottom slider upward into resilient contact with ball bearings 56 and, in effect, causes the tracks 120 to be resiliently sandwiched between top slider 121 and bottom slider 122. The underside of slider 121 is provided with a V-groove 60 and one U-groove 62, the object of which was explained in connection with guideway 50 and slider 59. Also attached to T-bar 123 are two spring mounts 125, screws 126 being used for this purpose. To each of these spring mounts are attached a leaf spring assembly 127.

As knob 115 is turned, bushing 119 presses against one of the spring assemblies 127, causing the top slider 121, bottom slider 122, and all associated components to move to the left or right. Near the end of slider travel, the spring resistance increases thus pre-warning the operator and minimizing any tendency to slam the slider into the stops 111 or spindles 114. Furthermore, as shown in FIGURE 3, at the limits of travel of crank 118 its horizontal axis has passed over horizontal center and, consequently, the springs 127 serve as detents which hold bushing 119 in the position shown.

Limits of slider travel are fixed by simultaneous adjustment of crank stops 11 and micrometers 113 and the adjustments are so made that the impact on stops 111 is maximized and impact on spindles 114 is minimized. Spindles 114 allow a reasonable amount of fine adjustment for any fixed setting of stops 111. Of course, total impact minimization is aided by leaf spring resistance. The extremes of top slider travel or "throw" are indicated in phantom in FIGURE 3.

7. *Heating Column*

The heating column, B, is shown in FIGURES 3 and 7–11 inclusive of which FIGURES 9–11 are most useful for purposes of exposition. The column includes a generally L-shaped supporting base 135 which is attached to the top slider 121 with a plurality of screws 136. A shoulder is provided in the front of base 135 to receive a non-conductive heater mounting plate 137 on which are mounted conductive end terminals 138 and center terminal 139. These terminals are electrically and mechanically connected to lugs 140 by two studs 141. The lugs are separated from base 135 by a non-conductive lug spacer 142. Studs 141 are threadedly mounted in end terminals 138 at one end and provided with nuts 143 at their other end. Base 135 is provided with insulated stud receiving apertures 144 which prevent short circuits while providing a passageway for the studs. An insulated path for current thus exists between feed wires 145 and end terminals 138. This path (i.e. studs 141) at the same time mechanically sandwiches the parts shown in FIGURE 10 between terminals 138 and nuts 143.

The tops of end terminals 138 are provided with a shoulder on each side (i.e. tongued) and center terminal 139 is similarly formed. In addition, terminal 139 is provided with a central transverse registration groove 146. On each side of the tongued portion of the terminals are placed high resistance heater strips 147 which include cut out portions 148 at the points where they span from terminal to terminal. Front clamping plates 149 and rear nut plates 150 protect and space the heater strips and the entire assembly of plates 149, 150 and heaters 147 is secured to heater mounting plate 137 with a plurality of screws 151. This construction allows for easy replacement of heaters 147 and, additionally, the overall construction allows for the replacement of mounting plate 137, with terminals and heaters affixed thereto, as a single unit.

The entire heater assembly may be enclosed by a gas cap 152 which is secured by a clamping stud 153 which passes, seriatim, through insulated aperture 154 in center terminal 139, plate 137, and is threadedly received by bracket 135. A gas lid 155, containing work holes or access ports 156, supported by the top of cap 152 and also resting on a shouldered portion of mounting plate 137, completes the enclosure. An inert "forming" gas (e.g. $H_2$, $N_2$, mixtures thereof, etc.) is supplied through hose 157 to a threaded gas tube 158 which serves to conduct gas through the depth of the assembled heating column and into the space enclosed by cap 152 and lid 155. The only exit for the gas is through work holes 156. Various nuts, threadedly mounted on tube 158, serve to make up the assembly shown and particularly to secure terminal cap 159 to the rear of base 135.

8. *Clamping Assembly*

The clamping assembly, D, is mounted on heating column B as particularly shown in FIGURES 7, 8 and 14. Assembly D moves with column B. Mounting of the assembly is effected with a shaft mount or bracket 165 which is attached to the back of base 135 with screws 166. Pivotally mounted within the bracket 165, by means of shaft 167, is a trident shaped rocker plate 168. Angular motion of plate 168 is limited by adjusting studs 169 which cooperate with anvil indents in bracket 165. The times of rocker plate 168 are notched to pivotally receive trunnion shaft 170 (see FIGURE 14). The ends of shaft 170 are grooved to receive and retain springs 171, the other ends of which are secured to spring hangers 172 mounted on bracket 165. Shaft 170 is thus resiliently retained in the notched tines of rocker plate 168. If desired, suitable bearings and spacers may be provided around shaft 170 at the points where it is supported by plate 168.

Pivotally mounted on shaft 170 are a pair of L-shaped arms 173, on the other ends of which is a rotatably mounted clamp operating handle 174. Tongue clamps 175 are mounted between insulating blocks 176 on arms 173 with screws 177. A clamping pin 178 is releasably and adjustably mounted at the split end of each tongue clamp 175. It is these pins which contact and hold down the partially assembled semiconductor translating devices. Arms 173 are tensioned downwardly by springs 179 which co-act with spring hangers 180 (on arms 173) and 181 (on base 135).

FIGURE 7 shows the clamping pins 178 in a forward or work holding position. Note that in this position plate 168 is cocked forward and arms 173 are substantially horizontal. In FIGURE 8, the assembly is shown in work loading position. The pins 178 are positioned on a pin rest plate 182 rather than on the work, plate 168 is cocked rearward (having moved as shown by the arrow in FIGURE 7) and arms 173 are slightly elevated. This change in position of the assembly is achieved by moving handle 174 as shown by the arrow in FIGURE 7. Because of pivot locations and spring tensions, both of these positions are equilibrium positions in which the pins 178 are resiliently stable. Pins 178 are able, as shown in FIGURE 7, to enter the aperture 156 and rest on the work.

9. *Wafer Registration Column*

The wafer registration column C, as shown in FIGURES 3 and 4, is mounted on the right hand end of lateral slider assembly A. It includes a baseway or guideway 200 on which are mounted a first stage slider 201 and a second stage slider 202 which moves at right angles to the first stage slider. Second stage slider 202 serves as a mount for pedestal 203 and the two sliders serve to position the pedestal along X and Y axes.

The first stage slider 201 is positioned by micrometer 204 and the second stage slider is positioned by micrometer 205 which are mounted, respectively, on baseway 200 and slider 201. Slider 201 is kept in resilient contact with the spindle of micrometer 204 by springs which are mounted within aligned springways 206 and operate in the same manner as those provided for positioning slider 59 (see FIGURE 13). Slider 202 is similarly maintained in contact with the spindle of micrometer 204. Finally, friction reducing means including ball bearings and spacer plates are provided between baseway 200 and slider 201 and also between slider 201 and slider 202. Slider 201 is attached to baseway 200; and slider 202 is attached to slider 201 using screws 207 in combination with gull-winged springs 208 in the manner discussed in connection with slider 59 and baseway 50 (as shown in FIGURES 12 and 13). Baseway 200 and pedestal 203 are both provided with internal cut out portions to receive and house springs 208 and their associated ball bearings and spacer plates.

Attached to pedestal 203, preferably in a vertically adjustable manner, is a hand rest 209 having a projecting portion 210 upon which the heel of the operator's hand may be supported. The top of hand rest 209 is also provided with a depressed circular cut out portion in which are mounted a bearing positioning disc 211 about which is a radial thrust bearing assembly 212. The thrust bearing supports a generally frustum shaped clamping mount 213 having one flat face, to which is attached a register plate 214. The sub-assembly of plate 214 and mount 213, as shown in FIGURE 5 is maintained in axial alignment by the combined effect of a plurality of bearings 215, mounted on hand rest 209, and toe clamp 216 which bears against the flat face of mount 213. Toe clamp 216 also exerts a downward force on the mount thus keeping it in face to face contact with bearing assembly 212. The shape of clamp 216 and mount 213 allows the subassembly shown in FIGURE 5 to be positively positioned and registered on hand rest 209 only when the flat face of 213 is in juxtaposition with the clamping toe. Clamp 216 is mounted on hand rest 209 with a plurality of shouldered spring-loaded studs 217, which are located on both sides of fulcrum pins 218. Thus, the sub-assembly of mount 213 and plate 214 is resiliently retained in registered position and yet may be easily removed without tools. This feature permits preloading of interchangeable plates with water as part of a semi-continuous production procedure.

Details of register plate 214 are shown in FIGURES 1 and 5. The plate includes a rectangular coined slot, generally designated as 219, which includes edges 220 and ramp 221. Two sides of the slot preferably coincide with the center lines of plate 214 and the depth of the slot is somewhat greater than the thickness of a semiconductor wafer 222. In operation, the wafer is slid down the ramp 221 and positioned in the corner, the corner thus constituting a positive indexing means for the wafer. However, if it is necessary to turn the wafer over before positioning, this may be accomplished merely by pushing it over an edge 220 with a tumbling motion and, thereafter, positioning it in the corner.

10. *Miscellaneous*

Auxiliary equipment such as a vacuum pump for connection to hose 103, power supplies for wires 101, connectors 140 and light 43; inert gas sources for connection to gas hose 157, and the like may be located on shelf 31 and operating switches provided either there or at a remote location. It is preferred that switches which have to be used often by the operator be close at hand, prefereably in a hand and/or foot operated array.

11. *Description of Method of Operation*

The method of the invention, briefly, is to position a wafer of semiconductor in a first registration zone, to position a partilly assembled semiconductor translating device in a second zone which bears a fixed relationship to the first zone, and to transfer the wafer from the first to the second zone by a combination of pure vertical motion of the wafer and pure horizontal motion of both zones along a linear or arcuate path. Once the wafer has been positioned on the header of the partially assembled device, it is fusion bonded thereto by raising the temperature of the translating device to a point where fusion bonding between semi-conductor material and the metallic header (or a coating thereon) of the transistor will occur. Bonding may also be achieved by placing a piece of gold foil or solder between the wafer and the header or mount which, when temperature is reached, will fuse one to the other. All during heating and bonding, provision may be made, if desired, to prevent oxidation of the surfaces which will be fused together. Sometimes fusion may be acceleration by limited vibration of the wafer.

The machine which has been described may be employed in theabove method as follows. With clamping assembly D in the position shown in FIGURE 8, two partially assembled semiconductor translating devices such as, for instance, a reference transistor 223 and an in-process transistor 228 are inserted and positioned on column B. As shown in FIGURE 2, transistor 223 includes a head 224, a flange tab 225 and a plurality of connectors 226. It also includes, as shown in FIGURE 14, a thermocouple 227, having lead wires 227*a*, which is permanently attached to the head 224. Transistor 228 is also provided with a head 229, a flange tab 230 and a plurality of connectors 231. The transistors are positioned so that they are supported by cut out portions 148 of heater strips 147 and tabs 225 and 230 are placed in registration groove 146. The position and orientation of both transistors are thus positively fixed and will remain constant throughout the subsequent method steps. Actually, different heater assemblies are provided for different production runs on different types of transistors and grooves 146 and cut outs 148 are carefully and accurately machined to insure positive registration and orientation.

The clamping assembly D is now placed in the position shown in FIGURE 7 and, as a consequence, clamping pins 178 penetrate access holes 156 and hold the two transistors in place. Current is now supplied to lugs 140 and the temperature of both transistors begins to rise (as shown in FIGURE 15) from $T_0$ to $T_1$. $T_0$ is ambient temperature and $T_1$ is a temperature below that at which a eutectic of semiconductor material and the metal on the head of the transistor 228 would form and fusion bonding occur. Thermocouple 227 provides a control parameter and can obviously be used to give a visual indication of temperature of both transistors (since they are identical units subjected to identical conditions a positive correlation between the temperature of transistor 228 and the voltage in leads 227*a* exists) or, if a more sophiscated apparatus is desired, as a signal voltage which will be used to regulate the flow of current to lugs 140 so that temporature $T_1$ will not be exceeded. At the commencement of current flow to lug 140 a flow of inert gas through gas hose 157 is begun in a volume designated as $V_1$ on FIGURE 15. The flow of gas passes across and around transistor heads 224 and 229, thus preventing oxidation of their surfaces which would otherwise occur as they were heated. Such oxidation would interfere with subsequent bonding operations. In subsequent operating cycles only transistor 228 is removed and transistor 223 remains in the position shown in FIGURE 9 to serve as a control throughout the production run.

Once the transistors have been placed in column B, the operator may turn his attention to registration column C. While looking through microscops 44, he positions a wafer 222 in the position shown in FIGURE 1. Vacuum needle 102, to which vacuum is being supplied through hose 103, is lowered using handle 78 until it touches the wafer. Counterweight 96 has been chosen and positioned on screw 97 so that the maximum force which can be exerted on the wafer by needle 102 before pivot casting 94 tilts will not be sufficient to damage or crack the wafer. When handle 78 is released, needle 102 will rise carrying with it the wafer in registered position. Operating knob 115 is now turned to its opposite limit of travel which has the effect of moving lateral slider assembly A and bringing the transistor head 229 under the vacuum needle (i.e. the vertical axis of the needle passes through a predetermined point on the head such as a point intermediate connections 231). The exact relationship which will exist between the needle 102 and head 229 is pre-set by micrometers 113 and stops 111 and may be varied for each production run.

By the time that knob 115 is turned, the temperature of the transistors is at or near $T_1$. Handle 78 is now operated again and the crystal 222 is placed and held in juxtaposition to head 229. Current flow to heaters 147 is now increased and temperature rises toward $T_2$, the temperature by which fusion of wafer to head has occurred. Simultaneously, if desired (e.g. when silicon wafers are used), oscillator 100 may be activated to aid fusion. Fusion occurs by $T_2$ and its occurrence may be observed by a flow of eutectic outwardly from the interface between the wafer and the transistor head. Since the microscope is focused on the centerline shown in FIGURES 1 and 2, the operator observes this flow of material. Heating is immediately discontinued and needle 102 raised. The needle will, of course, disengage from the now firmly bonded wafer. Once again, thermocouple 227 may be used as a means of automatically controlling the temperature rise from $T_1$ to $T_2$. As soon as fusion occurs current flow to the heaters is decreased and gas volume is increased to $V_2$ in order to cool the transistors to about $T_0$ so that transistor 228 may be comfortably removed. Assembly D is returned to the position shown in FIGURE 8, transistor 228 removed and the cycle is ready to begin again. Obviously overlaps in operating functions are possible and desirable such as, for instance, positioning of a new wafer in slot 219 while transistor 228 is cooling.

Having thus described the invention and the present embodiments thereof, it is desired to emphasize the fact that many modifications may be resorted to in a manner limited only by a just interpretation of the following claims.

We claim:

1. In a device for mounting and fusion bonding a semiconductor body on a partially assembled semiconductor translating device; a frame; a slider mounted on said frame capable of horizontal motion with respect thereto, adjustable limits on each side of said slider for restricting its travel, means for causing said slider to move from one limit of travel to the other; a registration column mounted on one portion of said slider including a transversely and laterally positionable semiconductor body registration plate, positive semiconductor body registration means on said plate; a heating column mounted on another portion of said slider including means for holding and heating a partially assembled translating device; a vacuum needle intermediate said columns capable of retaining a positioned semiconductor body thereon when vacuum is applied thereto; means for raising and lowering said needle into contact with said plate and said translating device on a fixed vertical axis; the vertical axis of said needle being in alignment with said positive body registration means of said registration plate when said slider is at one limit of travel and in alignment with a predetermined point on said partially assembled translating device when said slider is at the other limit of travel.

2. The device of claim 1 wherein said positive registration means on said registration plate comprises a coined, generally rectangular slot having a ramp leading downward from said plate to the flat bottom of said slot and including vertical walls, the height of which is substantially greater than the thickness of the semiconductor body to be positioned therein.

3. The device of claim 2 which further includes means for vibrating said vacuum needle.

4. In a device of the character described, a lateral slider comprising a hollow, generally rectangular base including a longitudinal aperture in the top thereof; a pair of parallel longitudinal guide tracks mounted on said base on each side of said aperture; a top slider slideably mounted on said tracks including a vertical bar dependent from said slider which protrudes between said tracks into the interior of said base; friction reducing means between said top slider and said tracks; adjustable limiting means at each end of said base adapted to limit lateral motion of said top slider; a bottom slider within said base resiliently attached to said vertical bar and in resilient contact with the underside of said tracks; friction reducing means between said tracks and said bottom slider; crank means mounted in said base including operating means and means for limiting the arcuate path of crank travel; leaf spring assemblies attached to said vertical bar on each side of the transverse center thereof; means for transmitting the throw of said crank to either of said spring assemblies; said lateral slider being capable only of precisely limited reciprocal horizontal motion along a fixed axis and said leaf spring assemblies functioning as detents at each extreme of slider travel.

5. In a device of the character described, a heating column comprising a vertical bracket, electrical terminals mounted vertically on said bracket, a plurality of heating strips mounted across said terminals and laminatedly affixed thereto said strips spanning the distance between said terminals, cut out portions in those portions of the heating strips between said terminals adapted to receive and support semiconductor translating devices, registration means in at least one of said terminals for effecting angular orientation of said translating devices, a gas enclosure surrounding said terminals and said translating device mounts, a gas inlet located within said enclosure, gas exit means located proximate said cut out portions of said heating strips and spaced so that gas flow passes over translating devices mounted therein, clamping means mounted on said bracket including clamping pins adapted to releasably retain semiconductor translating devices on said cut out portions of said heaters.

6. In a device of the character described, a vacuum needle manipulating assembly comprising a baseway; a horizontal slider mounted on said baseway capable only of limited reciprocal horizontal motion with respect thereto; micrometer means for positioning said slider; means for resiliently keeping said slider in contact with said micrometer means; friction reducing means between said baseway and said horizontal slider; a bracket mounted on said slider; a vertical baseway mounted on said bracket; a vertical slider mounted on said vertical baseway capable only of reciprocal vertical motion with respect thereto; an eccentric abutting said vertical slider; means for keeping said eccentric and said slider in resilient contact; and handle means for rotating said eccentric to cause vertical movement of said slider.

7. In a device of the character described, a vacuum needle manipulating assembly including a vertical slider; a vacuum needle pivot housing mounted on said vertical slider; a support casting pivotally mounted in said housing; a counterweight adjustably mounted in said support casting on one side of its pivot point; a needle support arm mounted on said casting on the other side of its pivot point and a vacuum needle mounted in said support arm.

8. The device of claim 7 which further includes an oscillator mounted on said needle support arm.

9. In a device of the character described, a wafer registration column comprising a baseway; a first stage slider mounted on said baseway for reciprocal movement along a first horizontal axis; friction reducing means between said baseway and said first stage slider; micrometer means for positioning said first stage slider; means for keeping said first stage slider in resilient contact with said micrometer means; a second stage slider mounted on said first stage slider for reciprocal movement along a second horizontal axis substantially at right angles to said first horizontal axis; friction reducing means between said first stage slider and said second stage slider; micrometer means for positioning said second stage slider; means for keeping said second stage slider in resilient contact with said micrometer means; a pedestal mounted on said second stage slider; a hand rest mounted on said pedestal; a registration plate releasably clamped to said hand rest capable of being mounted thereon in only one registered position, said registration plate including means thereon for positively registering a wafer.

10. The device of claim 9 wherein said positive registration means on said registration plate comprises a coined, generally rectangular flat bottomed slot including a ramp from said plate to the botom of said slot and vertical walls the height of which is substantially greater than the thickness of a wafer.

11. Apparatus for positioning a wafer of semiconductor upon a partially assembled semiconductor translating device comprising a first member; means for positioning a wafer of semiconductor upon said first member; a second member; means for positioning a partially assembled semiconductor translating device on said second member; elevator means for lifting a wafer upwardly from said first member on a fixed vertical axis; means for simultaneously laterally displacing both said first member and said second member until said fixed vertical axis passes through a predetermined point in said second member within the confines of said partially assembled device positioned thereon; and means for lowering said wafer into juxtaposition with said translating device.

12. Apparatus for positioning and bonding a wafer of semiconductor upon a partially assembled translating device comprising a registration member; means for positioning a wafer of semiconductor on said registration member; a heating member; means for positioning a partially assembled semiconductor translating device on said heating member; means for heating said translating device on said heating member from ambient temperature to a temperature below the fusion temperature of said wafer and means for simultaneously causing inert gas to flow over said translating device; means for lifting said wafer upwardly from said registration member on a fixed vertical axis; means for simultaneously displacing both said registration member and said heating member in a horizontal plane until said fixed vertical axis passes through a predetermined point on said heating member within the confines of said partially assembled translating device; means for lowering said wafer into juxtaposition with said translating device; means for raising the temperature of said translating device until said wafer fuses thereto; and means for increasing the flow of inert gas to cool the assembled device.

13. The apparatus of claim 12 which further includes means for vibrating said wafer while it is in juxtaposition with said partially assembled translating device prior to the fusion of said wafer thereto.

References Cited in the file of this patent

UNITED STATES PATENTS

| | | |
|---|---|---|
| 2,301,915 | Harrington | Nov. 17, 1942 |
| 2,308,658 | Jendresen | Jan. 19, 1943 |
| 2,792,489 | Wohlman | May 14, 1957 |
| 2,795,687 | Hall et al. | June 11, 1957 |
| 2,867,899 | Jacobs | Jan. 13, 1959 |
| 2,894,112 | Brescka et al. | July 7, 1959 |
| 2,911,114 | Gartner | Nov. 3, 1959 |
| 3,048,690 | Byrnes et al. | Aug. 7, 1962 |
| 3,050,617 | Lasch et al. | Aug. 21, 1962 |